United States Patent [19]
Dill

[11] Patent Number: 6,053,694
[45] Date of Patent: Apr. 25, 2000

[54] ROTATABLE WAFER HANDLER WITH RETRACTABLE STOPS

[75] Inventor: Charles T. Dill, San Jose, Calif.

[73] Assignee: H-Square Corporation, Sunnyvale, Calif.

[21] Appl. No.: 09/105,890

[22] Filed: Jun. 26, 1998

[51] Int. Cl.$^7$ ................................................ B65G 49/07
[52] U.S. Cl. ...................... 414/778; 414/816; 414/937
[58] Field of Search ................................. 414/403, 416, 414/941, 937, 810, 811, 816, 778, 782

[56] References Cited

U.S. PATENT DOCUMENTS

| | | | |
|---|---|---|---|
| 4,311,427 | 1/1982 | Coad et al. | 414/417 |
| 4,449,885 | 5/1984 | Hertel et al. | 414/750 |
| 5,468,112 | 11/1995 | Ishii et al. | 414/937 X |
| 5,615,988 | 4/1997 | Wiesler et al. | 414/416 |
| 5,660,517 | 8/1997 | Thompson et al. | 414/416 X |

Primary Examiner—Janice L. Krizek
Attorney, Agent, or Firm—Law Offices of Terry McHugh

[57] ABSTRACT

A method and device for handling fabrication articles in an electronics application includes a pickup head with an array of article-holding slots aligned to receive the articles and includes a drive mechanism for tilting the pickup head. Cantilevered support members, such as support rods, have first ends attached to the pickup head and are arranged to form article-receiving regions that are generally aligned with the article-holding slots. In the preferred embodiment, the article-holding slots have a geometry for supporting the fabrication articles when the support members are in an upright condition, i.e. when the articles are vertically oriented. Also in the preferred embodiment, the device includes stops that prevent the articles from entering the slots when the support members are in a horizontal condition. The stops provide a controlled exit and entrance of the articles from and into the slots as the pickup head is tilted, thereby reducing the risk of breakage. Typically, the fabrication articles are semiconductor wafers.

16 Claims, 5 Drawing Sheets

ROTATABLE WAFER HANDLER WITH RETRACTABLE STOPS

TECHNICAL FIELD

The invention relates generally to devices and methods for handling fabrication articles, such as semiconductor wafers, and relates more particularly to devices and methods for shifting a number of such articles between horizontal positions and vertical positions.

BACKGROUND ART

Wafer transfer systems are used to provide an automated transfer of semiconductor wafers from one position to another position. For example, the wafers contained in a cassette may be moved individually to a processing chamber for depositing or patterning a layer of material. Alteratively, all of the wafers within a cassette may be transferred simultaneously for batch processing. Thus, it is necessary in some applications to remove all of the wafers from a cassette or other device in a single operation.

U.S. Pat. No. 4,449,885 to Hurtel et al describes a wafer transfer system for moving semiconductor wafers between a cassette and a processing chamber. The system includes a cassette conveyer assembly for properly positioning the cassette relative to an elevator blade which vertically raises and lowers individual wafers to and from the processing chamber. The elevator blade is actuated by a crank that is driven by a motor and a mechanical stepper. The crank is able to convert the rotary stepping motion of the drive motor to reciprocating linear motion having relatively low velocity near its end points and relatively high velocity near its midpoint. Thus, there is a high rate of wafer transfer with the area associated with a low risk of damage to the wafer.

Another linear wafer transfer system is described in U.S. Pat. No. 4,311,427 to Coad et al. The system provides automated handling and transfer of wafers individually and repetitively between processing stations and cassettes. A track-like conveyer engages a cassette having a number of wafers that are vertically aligned. The conveyer moves the cassette horizontally relative to a vertically movable blade that passes between the tracks of the conveyer and through the cassette to engage a single wafer. The wafer is then moved vertically to a processing chamber. In the operation of the processing chamber, the wafer is returned to the cassette or is deposited in a second cassette by the blade.

The transfer systems of Hurtel et al and Coad et al maintain the wafers in a vertical orientation during horizontal movement of the cassette and vertical movement of the elevator. This is at least partially a result of concerns regarding using automated equipment to shift semiconductor wafers between vertical and horizontal orientations. Semiconductor wafers are fragile devices that are susceptible to breakage. Moreover, minute particles will reduce the manufacturing yield of integrated circuit fabrication. Typically, contact with the wafers is limited to wafer edges, reducing the likelihood that surface scratches will occur. However, this renders it difficult to remove multiple wafers from a cassette and simultaneously change the orientation of the wafers.

What is needed is a device and system for batch handling fabrication articles, such as semiconductor wafers, such that the wafers can be tilted with little risk of damage.

SUMMARY OF THE INVENTION

A device for simultaneously manipulating a number of fabrication articles includes a support head having an array of cantilevered support members that are arranged to define article-receiving regions. The article-receiving regions are generally aligned with slots in the support structure. The device includes a drive mechanism for tilting the support head such that the support members move between a horizontal condition and an upward-directed condition. Preferably, the upward-directed condition is one in which the support members are vertical. One or more stops extend into the slots when the support members are in the horizontal condition, but retract to enable the fabrication articles to reach seated positions within the slots when the support members are in the upward-directed condition.

The fabrication articles are typically semiconductor wafers, but may be masks or other planar articles that are used in the fabrication of integrated circuits. Alternatively, the fabrication articles may be devices for forming electro and/or electromechanical devices, such as hard disk read/write head wafers.

The stops enable the fabrication articles to seat within the article-holding slots of the support head as the drive mechanism rotates the support head from the horizontal condition to the upper-directed condition. When the support members are vertical, the fabrication articles are preferably primarily held in place by contact with the surfaces of the article-holding slot. That is, the fabrication articles are substantially contact-free from the support members when the fabrication articles are upright. When the drive mechanism moves the support member from the upward-directed condition to the horizontal condition, the stops gently push the fabrication articles from the slots before too much tension is placed on the edges of the articles. Thus, in the horizontal condition, the fabrication articles are at least primarily supported by the support members.

The cross sectional geometry of the slots is not critical to the invention. However, in the preferred embodiment, each slot includes an outer region with converging side surfaces and includes an inner region that is configured to seat the fabrication article. The outer region ensures that the fabrication article properly enters the slot, if a stop is not in an extended position that inhibits such entrance. The inner region is designed to support the fabrication article when the support members are in the vertical condition. Optionally, both of the regions include converging side surfaces.

The stops are mechanically moved between the extended position and the retracted position by tilting the support head, or by means of a motorized drive or a stepper drive. For example, the stops may be controlled by a linkage that is mechanically manipulated during the tilting operation. While not critical, the movement of the stops may be restricted to the ten degrees of head rotation nearest the positioning of the support members to the vertical. That is, movement of the stop or stops may be restricted to the last ten degrees of motion from the horizontal to the vertical orientations of the support members, and restricted to the first ten degrees of motion from the vertical to the horizontal orientations. It is believed that this embodiment significantly reduces the risk of damage to the fabrication articles. In an alternative embodiment, the stop or stops are fully retracted while the device is in the horizontal, allowing the fabrication articles to slide into the slots while the device moves to the vertical. When the device rotates from the vertical to the horizontal, the stop or stops are displaced to safely push the fabrication articles out of the slots.

The device may be used to move semiconductor wafers between a first cassette in which the wafers are stored horizontally and a second cassette in which the wafers are stored vertically. The process occurs automatically and with a low risk of wafer damage. An advantage of the device is that the wafers may be transferred to and from a low profile cassette in which the wafers are stored vertically.

DETAILED DESCRIPTION

Figure 1:
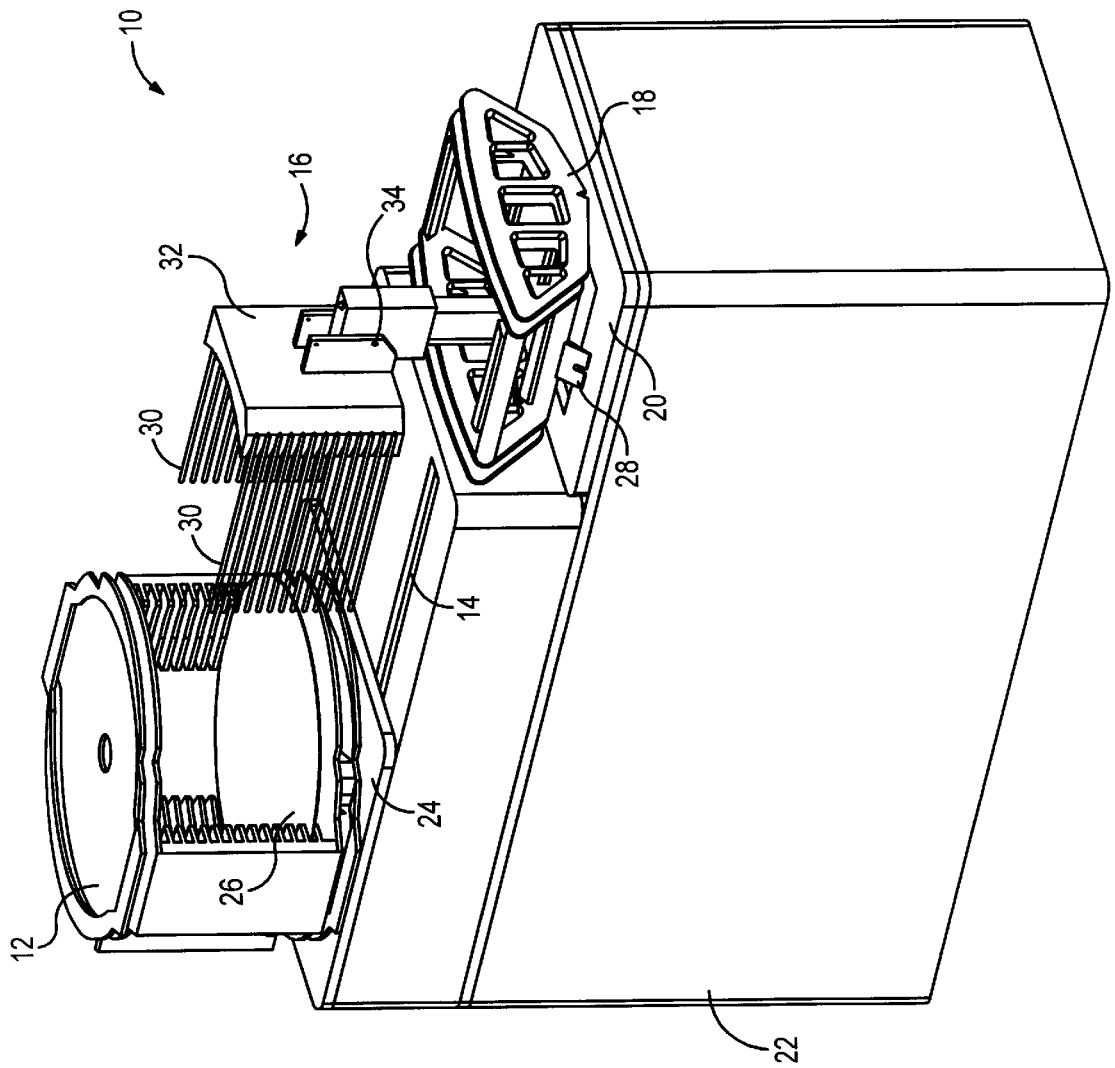
FIG. 1 is a perspective view of an automated transfer system for changing fabrication articles from a horizontally stored condition to a vertically stored condition.

With reference to FIG. 1, a transfer system 10 includes a first wafer cassette 12 that is mounted on rails 14 to move horizontally, a wafer handling device 16, and a second cassette 18 that is mounted on a vertically and horizontally displaceable plate 20. The handling device and the cassettes are supported by a housing 22. The dimensions of the housing are not critical to the invention. Exemplary dimensions are a width of 13 inches, a length of approximately 33 inches and a height of 23 inches from the bottom of the housing to a slide plate 24 on which the first cassette is mounted.

The wafer handling device 16 that will be described in detail below can be used to manipulate fabrication articles in transfer systems other than the one shown in FIG. 1. The device is designed primarily to exchange the articles between a horizontal storage position and a vertical storage position. The transfer may occur in either direction. The storage devices to and from which the articles are transferred may include low and high profile cassettes, forward opening universal pods (FOUPs), and 200 mm pods.

The first cassette 12 is shown as including only one fabrication article 26, but the cassette has the capacity to store a number of such articles in a parallel relationship. In the preferred embodiment, the fabrication articles are semiconductor wafers, such as 300 mm wafers. The first cassette of wafers moves horizontally toward and away from the handling device 16 by movement of the slide plate 24 along the rails 14. Preferably, the movement of the slide plate is motor driven.

The second cassette 18 receives the fabrication articles in a vertical orientation. While not shown in FIG. 1, the second cassette includes supporting structure for maintaining the articles in a spaced apart relationship with spacing that corresponds to the wafer-to-wafer spacing of the first cassette 12.

The second cassette 18 is properly positioned on the displaceable plate 20 on mounting brackets 28, only one of which is shown in FIG. 1. The displaceable plate 20 is raised and lowered by means of a motor, not shown. The plate 20 is also horizontally displaceable, again using motor drive. Both the first cassette 12 and the second cassette 18 are easily removable from the transfer system 10 and replaced with other cassettes of the same type.

In a transfer operation, the semiconductor wafer 26 is transferred to the first cassette 12 by horizontally moving the slide plate 24 toward the handling device. As will be explained in greater detail below, the transfer device includes two columns "or combs" of support members 30, with the support members in a column being spaced apart by a distance that corresponds to the arrangement of wafers within the first cassette 12. Thus, adjacent support members define an article-receiving region for picking up one of the wafers. Also to be explained more fully below, a pickup head 32 of the handling device 16 is rotatable about a horizontal axis 34, so that the handling device has a first position in which the article-receiving regions defined by the support members 30 are aligned with slots of the first cassette, and has a second position in which the article-receiving regions are aligned with slots or other wafer-supporting structure in the second cassette 18. In the operation illustrated in FIG. 1, the first position is a pickup position with the support members 30 being horizontal and the second position is a delivery position in which the support members are vertical. However, the handling device 16 may also be used to transfer wafers or other fabrication articles from the second cassette 18 to the first cassette 12.

Figure 2:
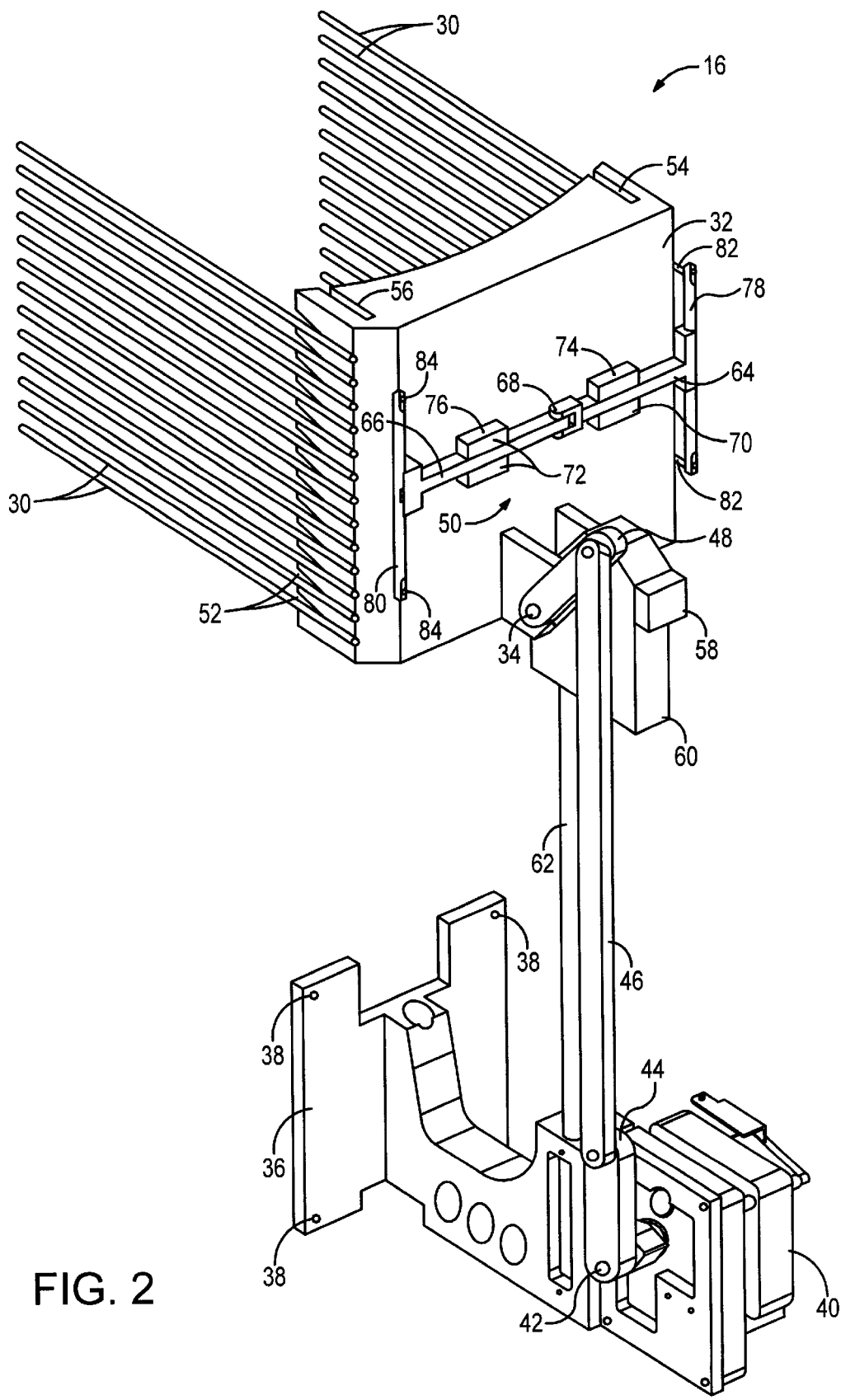
FIG. 2 is a perspective view of a device for performing the automated article handling of FIG. 1.

The handling device 16 is shown in greater detail in FIG. 2. The support members 30 are cantilevered support rods that have ends connected to the pickup head 32. The preferred distance between two support members in one of the columns is dependent upon the spacing between wafers in the cassettes between which the wafers are transferred. The distance between the two columns of support members is dependent upon the articles to be transferred. For example, if the articles are semiconductor wafers having a diameter of 300 mm, the spacing between the two columns of support members should be slightly less than 300 mm. Metal, ceramic or silicon carbide support rods may be used as the support members, but this is not critical.

A mounting bracket 36 is used to connect the handling device 16 to the housing 22 in the transfer system 10 of FIG. 1. The mounting bracket includes an array of bores 38 that receive bolts or other hardware for connecting the bracket to an internal wall of the housing.

An electrical motor 40 is used to drive the pickup head 32 between the first position in which the support members are horizontally directed and the second position in which the support members are vertically directed. The motor may be a stepper motor and may be AC or DC driven. The motor rotates a shaft 42 that is connected to a first linkage arm 44. Rotation of the shaft 42 causes rotation of the pickup head 32 about the axis 34 by means of a connection of the linkage arm 44 to a longitudinal arm 46 having an end connected to another linkage arm 48.

In addition to the linkage that causes pivoting of the pickup head 32 in response to operation of the motor 40, the handling device 16 includes linkage 50 for manipulating wafers stops that enable or inhibit the seating of the fabrication articles within slots 52 on the forward face of the pickup head 32. While not shown in FIG. 2, the wafer stops move forwardly and rearwardly within vertical grooves 54 and 56 that extend along the forward face of the pickup head. As will be explained more fully below, the wafer stops are spring biased to remain in an extended condition in which the wafer stops enter the article-receiving slots 52 to prevent wafers or other fabrication articles from reaching a seated position within the slots 52. The spring biasing also retains the linkage 50 within the linear state shown in FIG. 2. However, as the pickup head 32 nears the condition in which the support members 30 are vertical, the linkage 50 contacts a fixed block 58 that is attached to a member 60 secured to a shaft 62. This contact of the linkage 50 with the fixed block 58 provides a force that overcomes the spring bias on the wafer stops. Consequently, the wafer stops are retracted to a position that enables the fabrication articles to reach a seated position within the slots 52.

The linkage 50 includes a first arm 64 and a second arm 66 that are pivotably linked at inner ends. The fixed block 58 is aligned to contact the inner ends, so that there is rotation of the inner ends about an axis 68 when the motor 40 rotates the pickup head 32 such that the support members 30 are nearly vertical. In the preferred embodiment, the linkage 50 is in the linear condition shown in FIG. 2 until the pickup head is in the final ten degrees of rotation to the vertical. When the support members are returned to the horizontal position, the spring bias on the wafer stops returns the linkage to the linear condition of FIG. 2 within the first ten degrees of rotation. In the most preferred embodiment, the rotation is reserved to the final four degrees of rotation and first four degrees of rotation from the vertical. This restriction of movement is designed to minimize the risk of wafer breakage as the rotation of the pickup head shifts the weight of the wafers between the slots 52 and the support members 30. However, in some embodiments, the linkage may be formed such that there is a continuous movement of the wafer stops as the pickup head is rotated. In another embodiment, the wafer stops may remain retracted during rotations from the horizontal to the vertical, but move from the retracted condition to an extended condition during rotations from the vertical to the horizontal.

Figure 3:
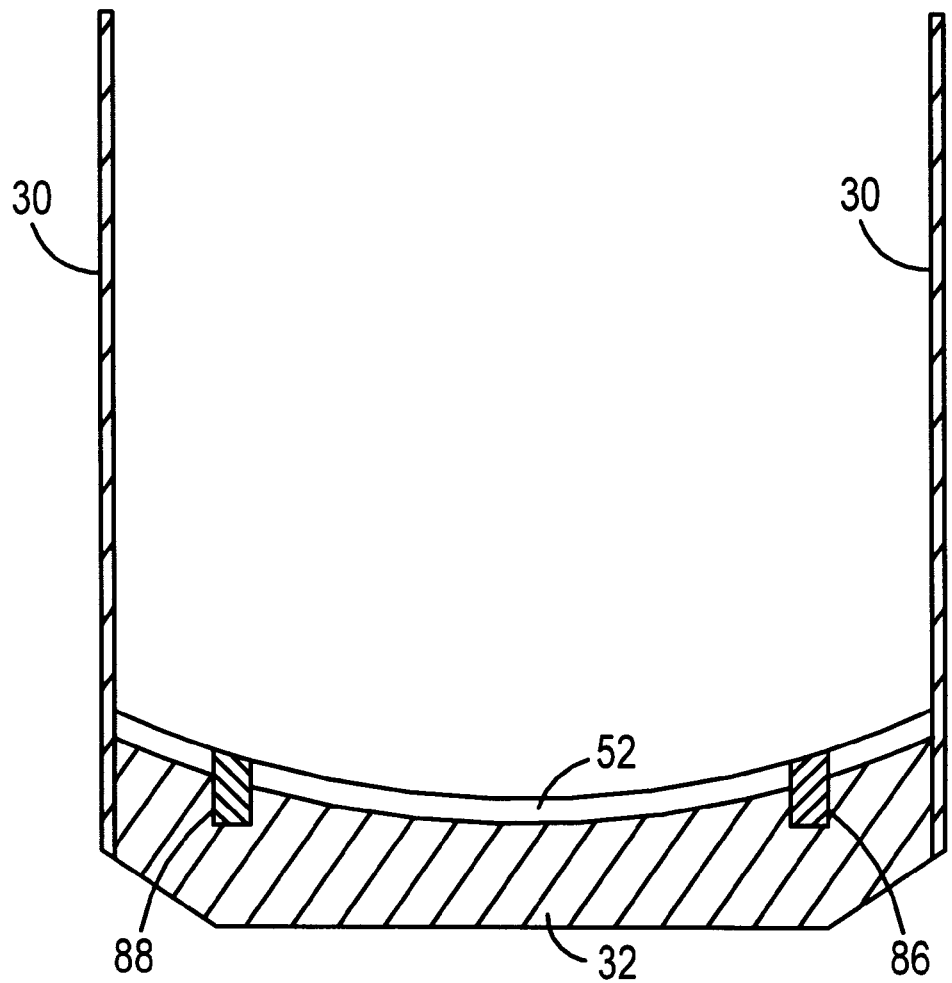
FIG. 3 is a top sectional view of the pickup head of FIG. 2 with wafer stops being shown in an extended condition.
Figure 4:
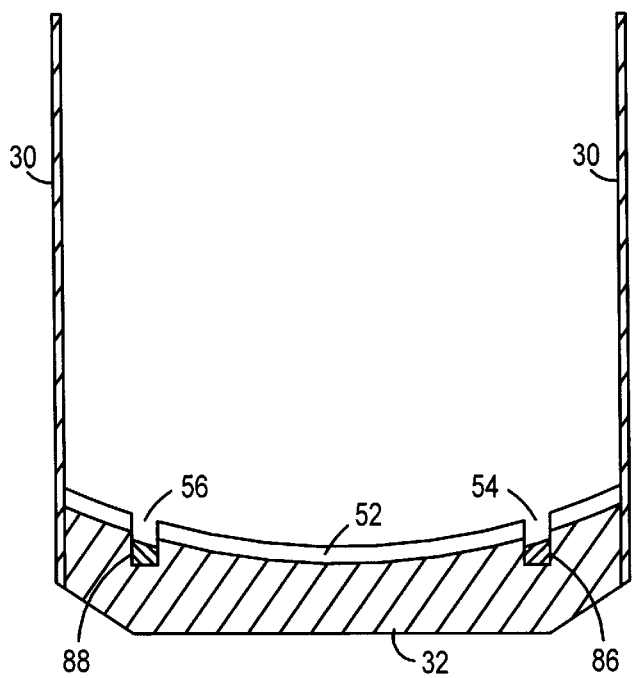
FIG. 4 is a top sectional view of the pickup head of FIG. 3, with the wafer stops shown in a retracted condition.

As previously noted, the inner ends of the first and second arms 64 and 66 rotate about the axis 68 upon contact of the inner ends with the fixed block 58. The central regions of the first and second arms are pivotably connected to blocks 70 and 72 at pivot points 74 and 76. As a result, the outer ends of the arms 64 and 66 move outwardly as the inner ends are pushed toward the pickup head 32 by contact with the fixed block 58. This overcomes the spring bias on the wafer stops, causing vertical members 78 and 80 to retract the wafer stops, thereby enabling the wafers to enter the slots 52. Pins 82 and 84 connect the vertical members to the wafer stops. FIGS. 3 and 4 are top views of the pickup head 32 when a sectional cut is taken through one of the fabrication article-receiving slots 52 of FIG. 2. In FIG. 3, the two wafer stops 86 and 88 are shown in a fully extended position, so that the wafer stops extend into the slots 52. This prevents a wafer or other fabrication article from entering the slot. As previously noted, the stops are in the fully extended position of FIG. 3 when the support members 30 are extended horizontally and the spring bias on the wafer stops places the linkage 50 of FIG. 2 in the illustrated linear condition.

Referring now to FIGS. 2 and 4, when the stepper motor 40 tilts the pickup head 32 sufficiently for the linkage 50 to make contact with the fixed block 58, the wafer stops 86 and 88 retract into the vertical grooves 54 and 56 sufficiently to enable the wafers to reach a seated position within the article-receiving slots 52. The contact of the linkage with the fixed block causes the first arm 64 of the linkage to rotate about pivot point 74 and causes the second arm 66 to rotate about pivot point 76. Consequently, vertical members 78 and 80 are pulled outwardly away from the pickup head 32. Since the vertical members are attached to the wafer stops 86 and 88, the wafer stops retract to the position shown in FIG. 4.

Figure 5:
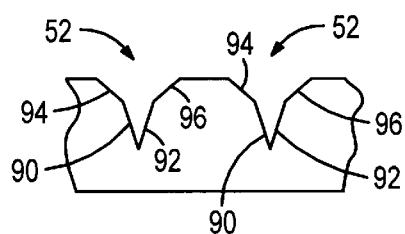
FIGS. 5 and 6 are cutaway side views of alternative embodiments of a portion of the pickup head of FIG. 2, showing the geometry of two article-holding slots.

In the preferred embodiment, the article-receiving slots 52 are designed to support the wafers or other fabrication articles when the pickup end 32 is rotated to position the support members 30 in a vertical condition. One possible configuration is shown in FIG. 5. Each slot 52 includes an inner region having walls 90 and 92 with slopes greater than slopes of walls 94 and 96 at an outer region of the slot. The greater convergence of the outer region is intended to ensure that a semiconductor wafer is funneled into the inner region. The angle between the planes of the walls 94 and 96 may be in the range of fifteen degrees to ninety degrees. The geometry of the inner region of each slot 52 is designed to support the semiconductor wafer or other fabrication article. An acceptable angle between the planes of the first and second walls 90 and 92 is thirty degrees. In an application in which 300 mm wafers are to be handled, the distance from the contact point of the first and second walls 90 and 92 to the exterior of the slot is 0.188 inch and the slot-to-slot pitch is 0.3937 inch (1.0 mm). However, this is not critical.

Figure 6:
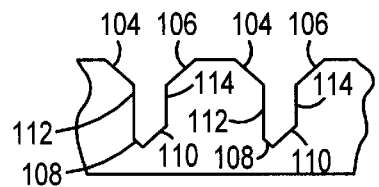

FIG. 6 is an alternate embodiment of slot geometry. In this embodiment, converging walls 104 and 106 of an outer region are separated from converging walls 108 and 110 of an inner region by an intermediate region that includes parallel walls 112 and 114. Optionally, the wall 114 may be longer than wall 112, with the walls 108 and 110 of the inner region being dimensioned to compensate for the difference. However, this is not critical. A variety of other embodiments may be substituted for FIGS. 5 and 6.

Figure 7:
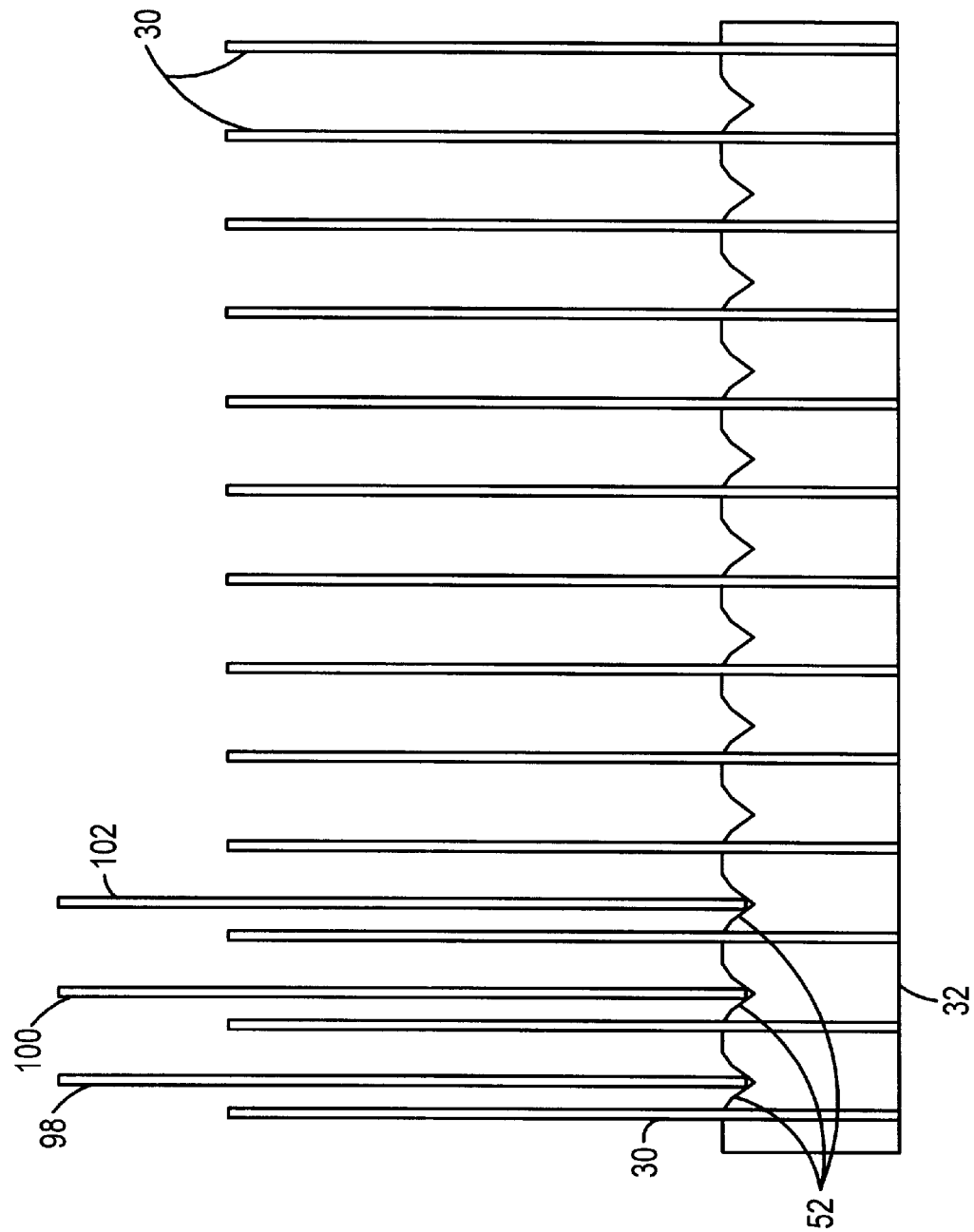
FIG. 7 is a side view of the pickup head of FIG. 2, with three semiconductor wafers being shown in a vertical condition.

FIG. 7 is a side view of the pickup head 32 with three semiconductor wafers 98, 100 and 102 being fully supported by contact of the wafers with the walls of the article-receiving slots 52. This is the preferred embodiment, since the wafers are not contacting the vertically oriented support members 30. However, as the pickup head is rotated in a counter clockwise direction, as viewed in FIG. 7, the wafer stops push the wafers 98–102 from the slots 52, transferring the weight of the wafers to the support members 30. The transfer occurs in a controlled manner that does not jeopardize the wafers.

In the operation of the transfer system 10 of FIG. 1, the first cassette 12 moves horizontally to the handling device 16. The support members 30 of the handling device define article-receiving regions that are aligned with any semiconductor wafers contained within the first cassette 12. The pickup head 32 may be mounted to raise slightly to transfer the semiconductor wafers from the first cassette to the support members 30. The first cassette can then be moved rearwardly.

As the pickup head 32 is rotated about the horizontal axis 34, the weight of the semiconductor wafers is progressively transferred to the wafer stops 86 and 88 of FIG. 3. Further tilting of the pickup head causes the wafer stops to retract to the position shown in FIG. 4, thereby allowing the semiconductor wafers to enter the article-receiving slots 52 when the support members 30 reach the vertical position. The preferred geometry of the slots 52 allows the semiconductor wafers to seat within the slots without contact with the support members, as shown in FIG. 6. However, this is not critical to the invention. The second cassette 18 of FIG. 1 is then raised to a settling point as the pickup head lowers the wafers in order to transfer the semiconductor wafers to the support structure within the second cassette. The second cassette can then be removed from the transfer system 10.

In the alternative direction, the semiconductor wafers may be initially contained within the second cassette 18 that is placed on the vertically and horizontally displaceable plate 20 when the displaceable plate is in a raised position and the pickup head 32 is tilted to a position in which the support members 30 are vertical. By lowering the displaceable plate 20 and raising the pickup head, the semiconductor wafers are transferred to the handling device 16. When the second cassette 18 is sufficiently cleared from the handling device, the pickup head 32 is rotated to the position shown in FIG. 1. The first cassette can then be moved horizontally to receive the semiconductor wafers.

While the handling device 16 is shown in a transfer system 10 in which both stations are cassette, the handling device may be used in other applications, such as transferring IC fabrication articles from one processing station to a second processing station. As another alternative embodiment, the second cassette 18 of FIG. 1 may be fixed in place and the pickup head 32 may be connected to descend into the housing 22 to transfer fabrication articles between the pickup head 32 and the cassette 18. That is, the shaft 62 of FIG. 2 may be motor driven to raise and lower the pickup head 32.

While the manipulation of the wafer stops has been described as being dependent upon contact of linkage 50 of FIG. 2 with the fixed block 58, other triggering mechanisms may be used. For example, the wafer stops may be controlled by operation of a cam mechanism.

What is claimed is:

1. A device for handling a plurality of fabrication articles used in an electronics industry comprising:

a support structure having an array of article-holding slots aligned in a generally parallel relationship to receive said fabrication articles, said support structure including slot walls that are configured to define each said article holding slot, said slot walls of each said article-holding slot being cooperative to form a seated position for one of said fabrication articles received in said article-holding slot;

a plurality of cantilevered support members having first ends attached to said support structure, said support members being arranged to form article-receiving regions that are generally aligned with said article-holding slots;

drive means for tilting said support structure such that said support members move between a horizontal condition and an upward-directed condition; and displaceable means having a first position for blocking each said fabrication article from said seated position when said support members are in said horizontal condition and having a second position for enabling access of said fabrication article into said seated position when said support members are in said upward-directed condition, said displaceable means being associated with said drive means to automatically move between said first position and said second position in response to said tilting of said support structure.

2. The device of claim 1 further including a linkage that retains said displaceable means in said first position for blocking said fabrication articles until said support members reach a nearly vertical condition, said linkage being coupled to said support structure.

3. The device of claim 2 further including a stationary block positioned to be free from contact with said linkage for at least eighty degrees of movement of said support structure as said support members move from said horizontal condition to said upward-directed condition, said linkage and said stationary block being cooperatively associated such that contact therebetween causes said displaceable means to move from said first position to said second position.

4. The device of claim 1 wherein said displaceable means includes at least one stop that projects into said article-holding slots to block said fabrication articles when said support members are in said horizontal condition.

5. The device of claim 4 wherein each said stop is spring biased to project into said article-holding slots.

6. The device of claim 1 wherein said slot walls that define each of said article-holding slots include an inner region with inwardly converging first and second surfaces and include an outer region with inwardly converging third and fourth surfaces, convergence of said third and fourth surfaces being different from convergence of said first and second surfaces.

7. The device of claim 1 wherein each said article-holding slot has a lengthwise curvature to receive an edge of a generally circular semiconductor wafer.

8. The device of claim 7 wherein said slot walls of each said article-holding slot are dimensioned to support said semiconductor wafer in a generally upright condition within said article-holding slot when said semiconductor wafer is in said seated position and said support members are upwardly-directed.

9. The device of claim 8 wherein said support members are two columns of rods, said columns being spaced apart by a distance less than a diameter of said semiconductor wafer.

10. A device for handling semiconductor wafers comprising:

a support head having an array of slots with a lengthwise curvature generally corresponding to an edge curvature of said semiconductor wafers, each said slot having a cross sectional geometry to fully support one of said semiconductor wafers when said support head is oriented such that said slot is directed upwardly;

support rods having first ends connected to said support head and having cantilevered second ends, said support rods being arranged to align said semiconductor wafers with said slots in a one-to-one relationship;

means for rotating said support head from a pickup position in which said support rods are generally horizontal to a delivery position in which said support rods are generally vertical, thereby directing said slots upwardly; and at least one stop having an extended position extending into said slots to restrict entrance of said semiconductor wafers into said slots, said at least one stop having a retracted position in which said semiconductor wafers are free to enter said slots, each said stop being operatively connected to said means for rotating such that said stop is in said extended position when said support rods are generally horizontal and said stop is in said retracted position when said support rods are generally vertical.

11. The device of claim 10 wherein said cross sectional geometry includes an inner region with walls that form a first narrowing configuration and an outer region with walls that define a second narrowing configuration having a convergence different than said first narrowing configuration.

12. The device of claim 10 further comprising mechanical linkage connected to each said stop for manipulating said stop in response to movement of said support head into said delivery position.

13. A method of handling a plurality of integrated circuit (IC) fabrication articles comprising the steps of:

arranging a plurality of cantilevered support rods to define an array of discrete article-receiving regions that are aligned with an array of article-holding slots at first ends of said support rods, including providing a one-to-one correspondence between said article-receiving regions and said article-holding slots;

picking up a number of said IC fabrication articles using said support rods while blocking said IC fabrication articles from seating within said article-holding slots when said support rods are positioned horizontally;

automatically unblocking said IC fabrication articles from entering within said article-holding slots when said support rods are mechanically rotated to a vertical orientation; and supporting said IC fabrication articles using said article-holding slots.

14. The method of claim 13 wherein said step of automatically unblocking said IC fabrication articles includes shifting at least one stop from a position extending into said article-holding slots when said support rods are positioned horizontally to a position removed from said article-holding slots when said support rods are in said vertical orientation.

15. The method of claim 14 wherein said step of automatically unblocking said IC fabrication articles is executed as an automated response to rotating said support rods from a horizontal position to a vertical position.

16. The method of claim 15 wherein said step of unblocking said IC fabrication articles is executed in a final ten degrees of rotation to said vertical position.

* * * * *